(12) United States Patent
Lavanga et al.

(10) Patent No.: US 9,779,935 B1
(45) Date of Patent: Oct. 3, 2017

(54) SEMICONDUCTOR SUBSTRATE WITH STRESS RELIEF REGIONS

(71) Applicant: Infineon Technologies Austria AG, Villach (AT)

(72) Inventors: Simone Lavanga, Faak am See (AT); Uttiya Chowdhury, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/090,904

(22) Filed: Apr. 5, 2016

(51) Int. Cl.
*H01L 21/02* (2006.01)
*H01L 29/15* (2006.01)
*H01L 29/20* (2006.01)
*H01L 29/205* (2006.01)
*H01L 29/66* (2006.01)
*H01L 29/778* (2006.01)
*H01L 29/04* (2006.01)

(52) U.S. Cl.
CPC .... *H01L 21/02507* (2013.01); *H01L 21/0251* (2013.01); *H01L 21/0254* (2013.01); *H01L 21/02381* (2013.01); *H01L 21/02433* (2013.01); *H01L 21/02458* (2013.01); *H01L 29/045* (2013.01); *H01L 29/155* (2013.01); *H01L 29/2003* (2013.01); *H01L 29/205* (2013.01); *H01L 29/66462* (2013.01); *H01L 29/7784* (2013.01)

(58) Field of Classification Search
CPC .......... H01L 21/02507; H01L 29/7784; H01L 29/2003; H01L 29/205; H01L 29/66462; H01L 21/0254; H01L 29/155; H01L 21/02381; H01L 21/02433; H01L 21/02458; H01L 21/0251; H01L 29/045
See application file for complete search history.

(56) References Cited

U.S. PATENT DOCUMENTS 5,753,967 A * 5/1998 Lin ................... H01L 21/31144
257/635
6,348,096 B1 * 2/2002 Sunakawa ............... C30B 25/02
117/88

(Continued)

OTHER PUBLICATIONS https://www.el-cat.com/silicon-properties.htm, pp. 1-12.*

*Primary Examiner* — Matthew Reames
*Assistant Examiner* — Vincent Wall
(74) *Attorney, Agent, or Firm* — Murphy, Bilak & Homiller, PLLC

(57) ABSTRACT

A crystalline base substrate including a first semiconductor material and having a main surface is provided. The base substrate is processed so as to damage a lattice structure of the base substrate in a first region that extends to the main surface without damaging a lattice structure of the base substrate in second regions that are adjacent to the first region. A first semiconductor layer of a second semiconductor material is formed on a portion of the main surface that includes the first and second regions. A third region of the first semiconductor layer covers the first region of the base substrate, and a fourth region of the first semiconductor layer covers the second region of the base substrate. The third region has a crystalline structure that is disorganized relative to a crystalline structure of the fourth region. The first and second semiconductor materials have different coefficients of thermal expansion.

15 Claims, 6 Drawing Sheets

(56) References Cited

U.S. PATENT DOCUMENTS

| | | | |
|---|---|---|---|
| 6,391,748 B1* | 5/2002 | Temkin | C30B 23/02 257/E21.127 |
| 8,227,280 B2* | 7/2012 | Niki | H01L 33/007 257/103 |
| 2002/0022287 A1* | 2/2002 | Linthicum | H01L 21/0237 438/46 |
| 2002/0069816 A1* | 6/2002 | Gehrke | C30B 25/02 117/84 |
| 2002/0102830 A1* | 8/2002 | Ishida | C30B 25/18 438/604 |
| 2014/0252375 A1* | 9/2014 | Briere | H01L 29/2003 257/77 |

* cited by examiner

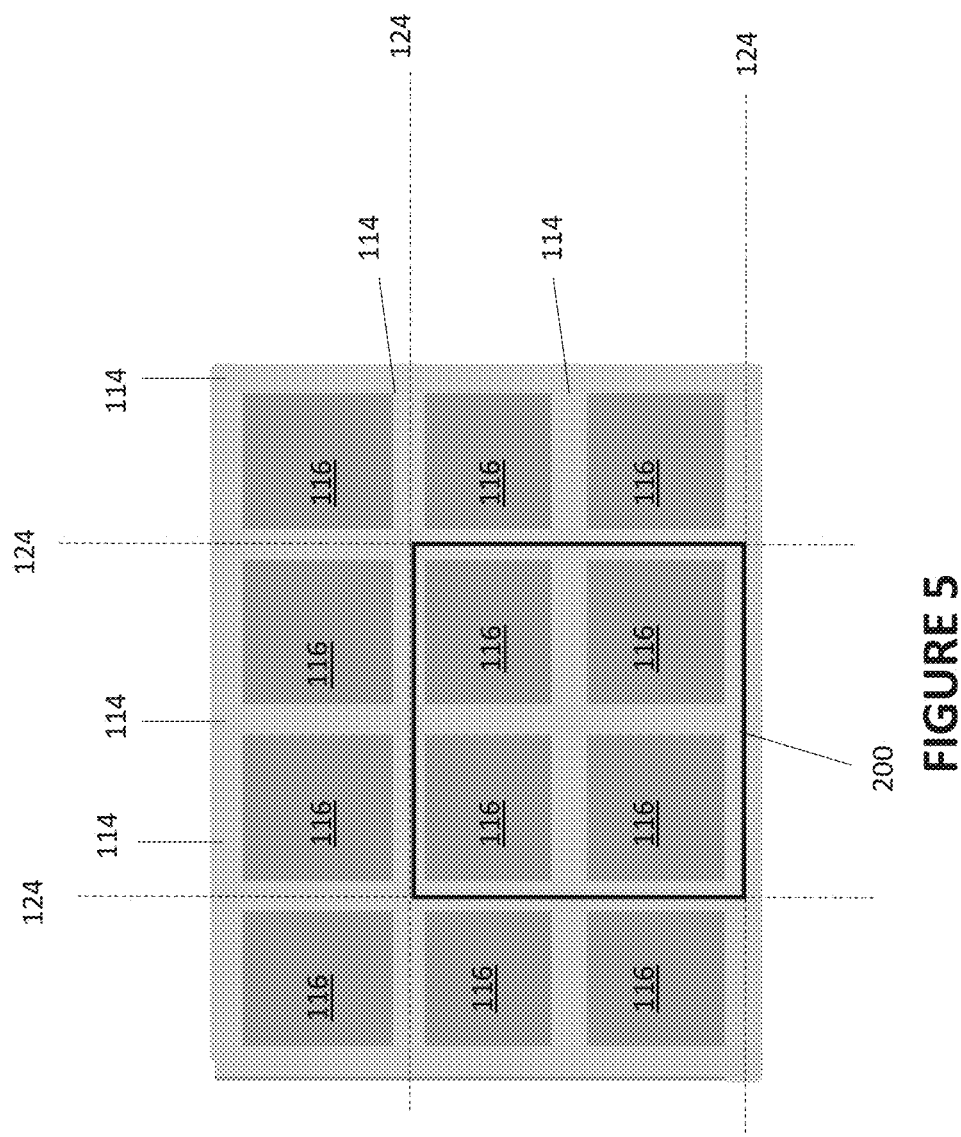

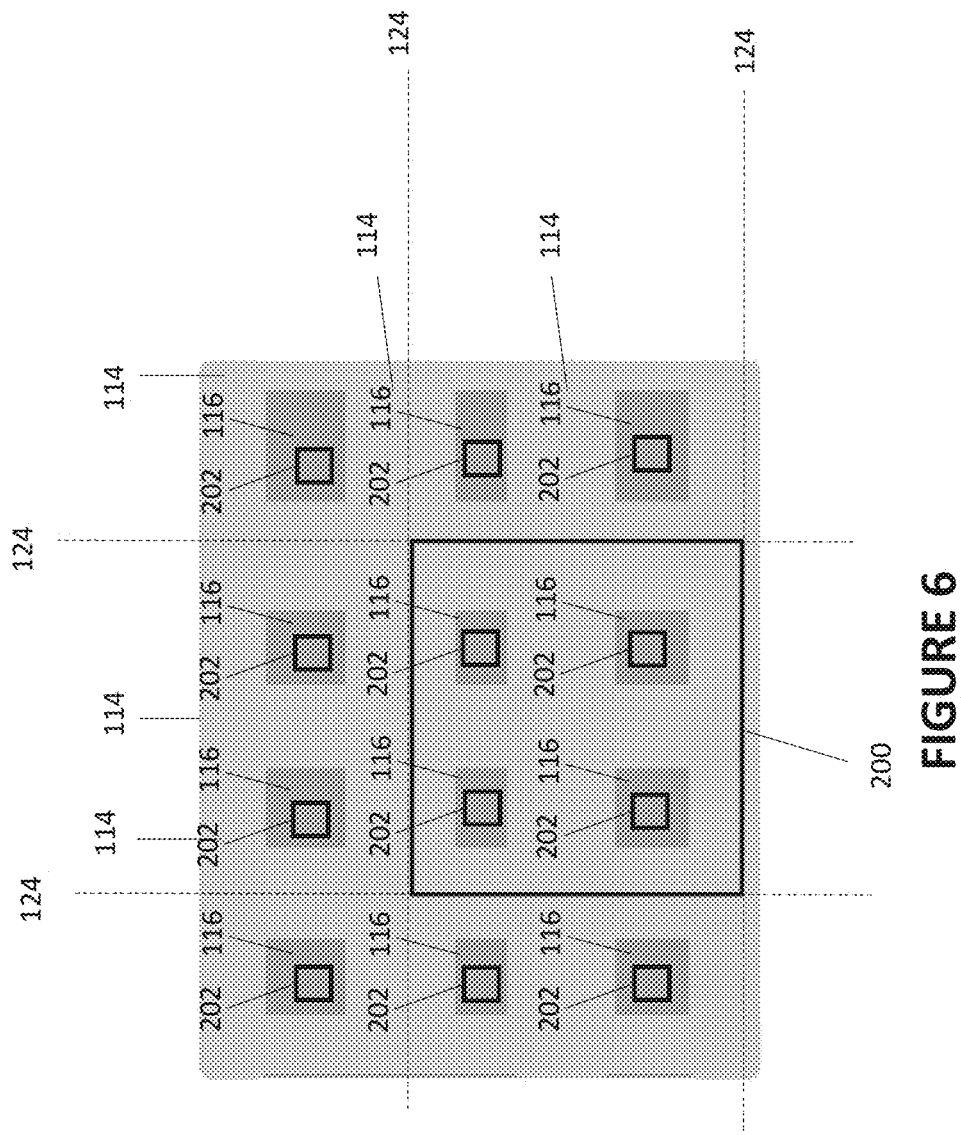

SEMICONDUCTOR SUBSTRATE WITH STRESS RELIEF REGIONS

TECHNICAL FIELD

The instant application relates to semiconductor substrates, and in particular relates to forming compound semiconductor substrates using materials with different coefficients of thermal expansion.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. HEMTs are preferred in many applications due to their favorable power density, on-state resistance, switching frequency, and efficiency benefits over conventional silicon-based transistors.

HEMTs are typically formed from type III-V semiconductor materials, such as GaN, GaAs, AlGaN, etc. In a GaN/AlGaN based HEMT, a two-dimensional electron gas (2DEG) forms at the interface between the AlGaN barrier layer and the GaN buffer layer. The 2DEG forms the channel of the device instead of a doped region, which forms the channel in a conventional MOSFET device.

One technique for forming a type III-V semiconductor substrate involves using a silicon wafer as a base substrate. A seed layer is formed on the silicon base substrate, and one or more III-V semiconductor material layers are epitaxially grown on the seed layer. Standard sized silicon wafers that are used in CMOS technology in particular are preferable as base substrates due to their abundance, low cost, and compatibility with standard processing equipment used in silicon fabrication facilities.

One challenge of epitaxially forming III-V semiconductor layers such as GaN on a silicon substrate relates to mechanical stress that arises between the silicon and the III-V semiconductor material. In general, mechanical stress makes the wafers difficult to process, can impact device performance, decrease uniformity of the material properties of the substrate (e.g., doping concentration) and can even lead to complete device failure.

One source of mechanical stress can be attributed to thermal expansion mismatch between the different materials. Epitaxial growth techniques typically involve high temperature cycles. For example, a typical MOCVD (metalorganic chemical vapor deposition) process is performed at temperatures in a range of 900° C.-1200° C. As the substrate cools, the substrate and epitaxial layers contract at different rates due to their different coefficients of thermal expansion.

One way to mitigate mechanical stress attributable to thermal expansion mismatch between the different materials involves incorporating a compensatory stress into the epitaxial layers during epitaxy. However, this produces a curved wafer during epitaxy, which in turn leads to temperature variation in the epitaxial layers across the wafer. This temperature variation impacts various fundamental properties such as alloy composition, doping and material quality. Specially shaped wafer carriers or thicker silicon substrates can mitigate the effect to an extent. However, these techniques are only partially effective, are expensive to implement, and come with other disadvantages.

SUMMARY

A method of forming a compound semiconductor substrate is disclosed. According to an embodiment, a crystalline base substrate including a first semiconductor material and having a main surface is provided. The base substrate is processed so as to damage a lattice structure of the base substrate in a first region that extends to the main surface without damaging a lattice structure of the base substrate in second regions that are adjacent to the first region. A first semiconductor layer of a second semiconductor material is formed on a portion of the main surface that includes the first and second regions. A third region of the first semiconductor layer covers the first region of the base substrate, and a fourth region of the first semiconductor layer covers the second region of the base substrate. The third region has a crystalline structure that is disorganized relative to a crystalline structure of the fourth region. The first semiconductor material has a different coefficient of thermal expansion than the second semiconductor material.

According to another embodiment, a crystalline base substrate including a first semiconductor material and having a main surface is provided. A first semiconductor layer is formed on the main surface and includes a pair of tracks disposed on either side of active device regions. The first semiconductor layer is formed from a second semiconductor material having a different coefficient of thermal expansion than the first semiconductor material. The pair of tracks have a relatively weaker crystalline structure than the active device regions. The base substrate and the first semiconductor layer are thermally cycled such that the first semiconductor layer expands and contracts at a different rate than the base substrate. The pair of tracks physically decouple adjacent ones of the active device regions during the thermal cycling.

A compound semiconductor substrate is disclosed. According to an embodiment, the compound semiconductor substrate includes a crystalline base substrate having a first region that extends to a main surface of the base substrate and has a crystalline structure that is disorganized relative to a crystalline structure of a second region of the base substrate that is adjacent the first region. The compound semiconductor substrate further includes a first semiconductor layer formed on the main surface and having a third region covering the first region of the base substrate and a fourth region of covering the second region of the base substrate. The third region has a crystalline structure that is disorganized relative to a crystalline structure of the fourth region. The base substrate has a different coefficient of thermal expansion than the first semiconductor layer.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 5 illustrates a compound substrate, from a partial plan-view perspective, according to an embodiment.

FIG. 6 illustrates a compound substrate, from a partial plan-view perspective, according to another embodiment.

DETAILED DESCRIPTION

According to embodiments described herein, a monocrystalline semiconductor substrate (e.g., a silicon substrate) is provided. The substrate has a main surface that extends along a single lattice plane, such as the <111> crystal lattice plane in the case of silicon. The substrate is processed so as to disrupt the crystal lattice plane and underlying crystallographic structure of the substrate in selected regions. This process makes these regions less conducive to perfect crystalline epitaxial growth. Subsequently, a high temperature epitaxial deposition process is used to form one or more III-V semiconductor layers (e.g., a GaN layer) on the substrate. The epitaxial layers include regions of relatively weak semiconductor material (e.g., polycrystalline or amorphous semiconductor material) that are grown on the damaged regions of the base substrate and regions of relatively strong semiconductor material (e.g., monocrystalline semiconductor material) that are grown on the undamaged regions of the base substrate. As the substrate cools from the epitaxy process, the epitaxial layers contract at a different rate than the base substrate due to a difference in coefficients of thermal expansion between the materials.

The regions of relatively weak semiconductor material in the epitaxial layers advantageously mitigate mechanical stress that arises in the substrate from the thermal cycling of the epitaxy process. The material structure of these regions is such that they will crack under the mechanical stress associated with the epitaxy process. These cracks interrupt any mechanical stress that is present in the epitaxial layer, and allow the non-cracked portions of the epitaxial layer to expand or contract independent from one another. As a result, a high-reliability type III-V semiconductor device layer can be formed with relatively uniform properties. The III-V semiconductor device regions can be made substantially larger without risk of wafer bowing or breakage. A further advantage of this process is that the regions of relatively weak semiconductor material are easily cut, e.g., by laser or mechanical sawing. Thus, these regions can serve as stress-relief mechanisms as well as die singulation regions.

Figure 1:
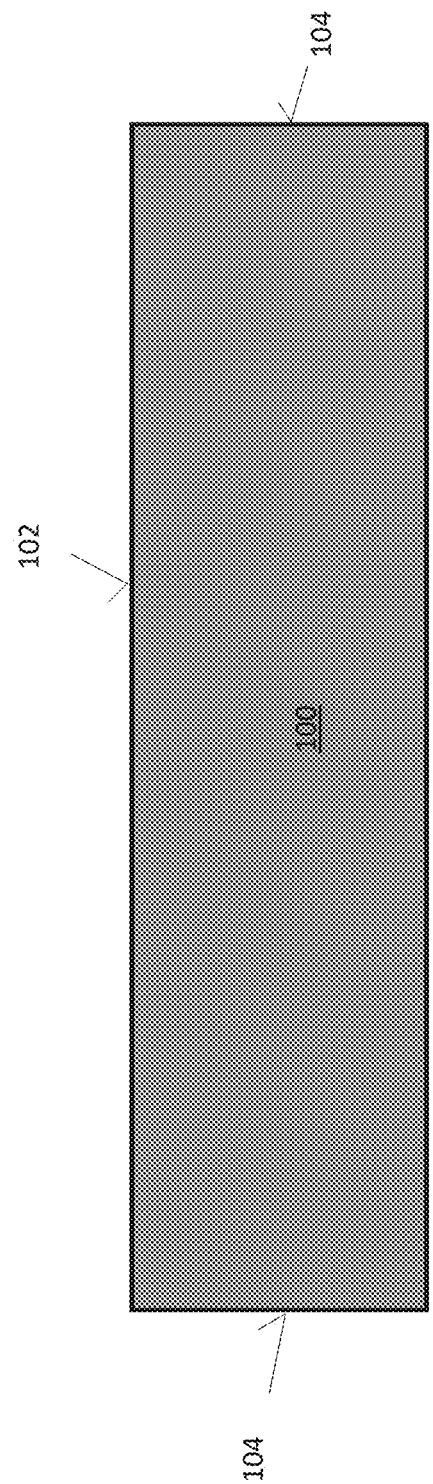
FIG. 1 illustrates a crystalline base substrate, from a cross-sectional perspective, according to an embodiment.

Referring to FIG. 1, a base substrate 100 is provided. The base substrate 100 can be formed from any crystalline semiconductor material suitable for manufacturing semiconductor devices, and in particular any material suitable for the epitaxial growth of a type III-V semiconductor nitride material thereon. Exemplary materials for base substrate 100 include silicon (Si), group IV compound semiconductor materials such as silicon carbide (SiC) or silicon germanium (SiGe). According to an embodiment, the base substrate 100 is formed from silicon.

The base substrate 100 has a main surface 102 that extends between edge sides 104 of the base substrate 100. According to an embodiment, the main surface 102 extends along a single crystal lattice plane. For example, the main surface 102 may extend along the <111> lattice plane of the silicon crystals, e.g., in the case that the base substrate 100 is a silicon substrate.

Figure 2:
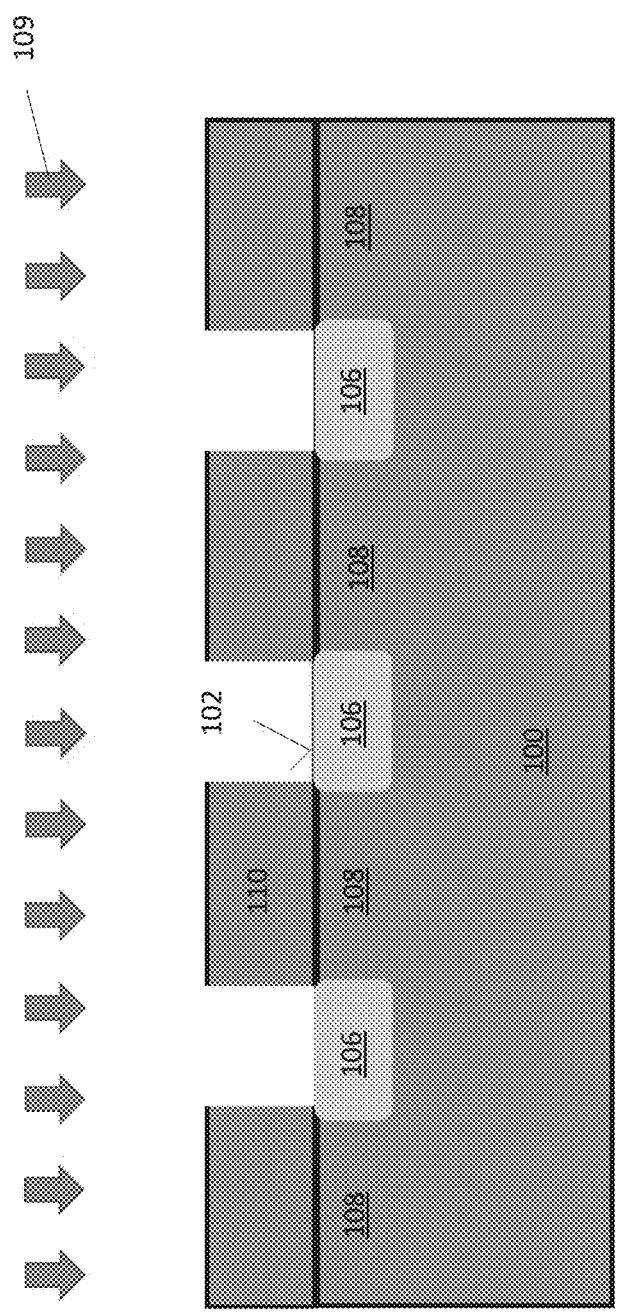
FIG. 2 illustrates the base substrate being processed to locally damage a crystalline structure of the base substrate in selected regions, from a cross-sectional perspective, according to an embodiment.

Referring to FIG. 2, the main surface 102 of the base substrate 100 is processed so as to damage the base substrate 100 selected first regions 106 without damaging adjacent second regions 108 of the base substrate 100. As a result of this processing step, the main surface 102 is disrupted in the first regions 106. For example, in the case that the main surface 102 initially extended along the <111> lattice plane, the processing step of FIG. 2 exposes other crystal lattice planes (e.g. <101>, <100>, etc.) at the main surface 102. Moreover, this processing step causes the crystalline structure of the semiconductor material in the first regions 106 beneath the main surface 102 to be disorganized relative to the crystalline structure of the semiconductor material in the second regions 108. That is, the substrate is no longer monocrystalline and includes point defects.

According to an embodiment, the first regions 106 are formed by a patterning technique. According to this technique, a photolithographic mask 110 is provided on the main surface 102 and subsequently patterned (e.g., by etching) so as to expose the first regions 106 while the second regions 108 remain covered by the mask 100. Alternatively, the photolithographic mask 110 may be used to pattern a hard mask (not shown), such as an SiNy or SiOx hard mask, which in turn is used to cover the second regions 108 and expose the first regions 106. Subsequently, the base substrate 100 is exposed to charged ions 109. These charged ions 109 damage the main surface 102 and disorganize the crystalline structure of the base substrate 100. The charged ions 109 can be provided by a plasma treatment technique or an ion implantation technique. More specifically, the charged ions 109 can be provided by a reactive ion etching (RIE) technique or an inductively coupled plasma (ICP) technique.

Figure 3:
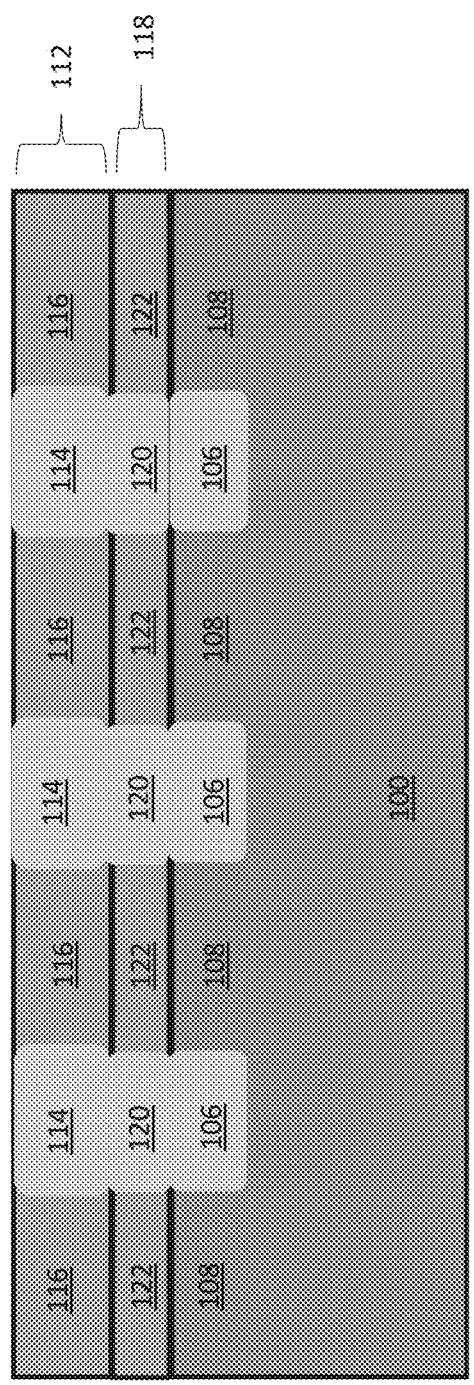
FIG. 3 illustrates a compound substrate, from a cross-sectional perspective, according to an embodiment.

Referring to FIG. 3, the mask 110 has been removed and a first semiconductor layer 112 has been formed on the main surface 102. The first semiconductor layer 112 includes a semiconductor material having a different coefficient of thermal expansion than the material of the base substrate 100. For example, according to an embodiment, the base substrate 100 includes silicon and the first semiconductor layer 112 includes a type III-V semiconductor, such as GaN, GaAs, InGaN, AlGaN, etc.

The first semiconductor layer 112 is formed over the first and second regions 108 and can partially or completely cover the main surface 102 of the base substrate 100. Third regions 114 of the first semiconductor layer 112 cover the first regions 106 of the base substrate 100, and fourth regions 116 of the first semiconductor layer 112 cover the second regions 108 of the base substrate 100. The third regions 114 have a crystalline structure that is disorganized relative to the crystalline structure of the fourth regions 116. For example, the fourth regions 116 may be monocrystalline regions, whereas the third regions 114 may be polycrystalline regions or amorphous regions. Any number of additional layers (not shown) can be formed on the first semiconductor layer 112. For example, in the case of a GaN based HEMT device, the first semiconductor layer 112 can be an undoped GaN buffer layer, and an additional AlGaN barrier layer can be grown on the first semiconductor layer 112.

According to an embodiment, prior to forming the first semiconductor layer 112, a transition layer 118 is formed on the main surface 102. The transition layer 118 is configured to alleviate stress due to lattice mismatch between the material of the base substrate 100 and the material of the first semiconductor layer 112 and to provide a relatively defect free surface for the formation first semiconductor layer 112. The transition layer 118 will typically include a nucleation layer, such as a thin AlN layer, followed by other layers for transitioning the growth into GaN. These layers may include step-graded layers of AlGaN, continuously graded layers of AlGaN and periodic or aperiodic superlattice structures.

The transition layer 118 includes fifth regions 120 that are formed on and cover the first regions 106 of the base substrate 100 and sixth regions 122 that are formed on and cover the second regions 106 of the base substrate 100. The fifth regions 120 have a relatively disorganized crystalline structure in comparison to the sixth regions 122.

Both the transition layer 118 and the first semiconductor layer 112 can be formed by epitaxy. Typically, in epitaxial processes, the crystallographic orientations of deposited layers are dependent upon the crystallographic orientation of the subjacent material. This principle is used to grow the transition layer 118 and the first semiconductor layer 112 such that they include the regions with a relatively disorganized crystalline structure (i.e., the third regions 114 and the fifth regions 120). Further, the regions with a relatively organized and physically stronger crystalline structure (i.e., the fourth regions 116 and the sixth regions 108) form on the undamaged portions of the substrate 100.

Generally speaking, the epitaxial deposition process used to form the transition layer 118 and the first semiconductor layer 112 can be any of a variety of conventionally known epitaxial processes. For example, according to an embodiment, the first semiconductor layer 112 and the transition layer 118 are formed by a MOCVD (metalorganic chemical vapor deposition) process. The MOCVD process may be carried out at high temperatures, such as in the range of 700° C.-1200° C.

The crystalline structure of the third and fifth regions 114, 120 can be determined by appropriately controlling the process parameters epitaxial deposition process, such as time and temperature. In particular, the time and temperature of the epitaxial deposition process can be controlled such that the third and fifth regions 114, 120 are polycrystalline regions. In a different embodiment, the time and temperature of the epitaxial deposition process is controlled such that the third and fifth regions 114, 120 are amorphous regions.

Figure 4:
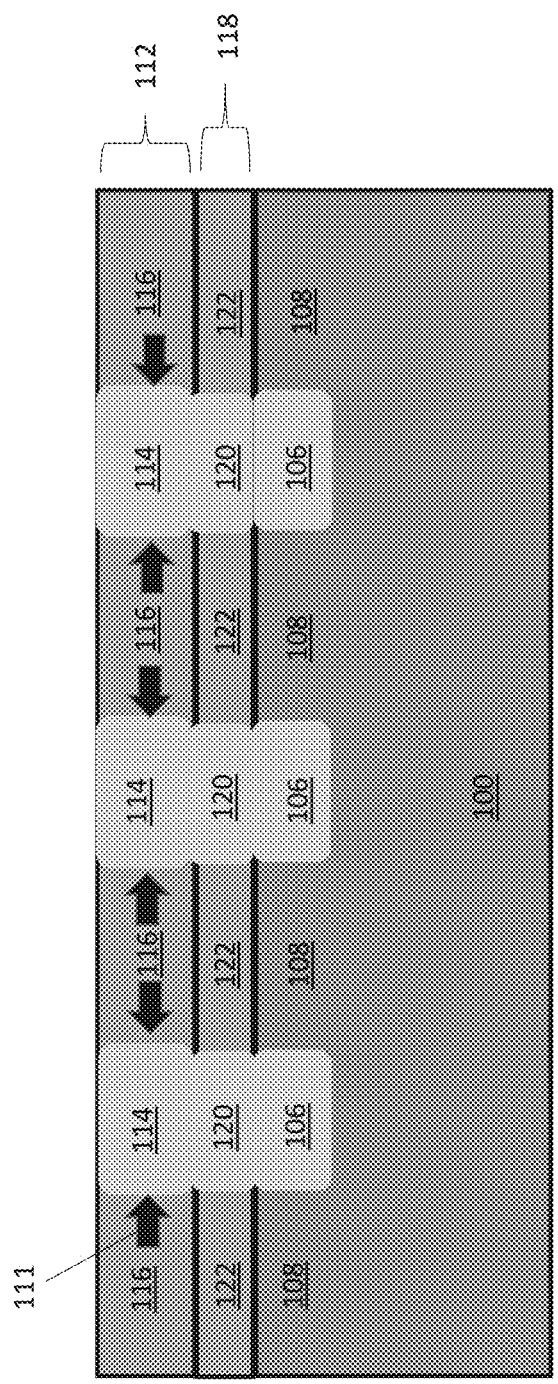
FIG. 4 illustrates mechanical stresses in an epitaxial layer of the compound substrate during a thermal cycle, from a cross-sectional perspective, according to an embodiment.

Referring to FIG. 4, a compound substrate is shown with the mechanical forces 111 in the first semiconductor layer 112 depicted by arrows. This stress arises during the cool down cycle of the epitaxy process. This stress force is attributable to the difference in coefficient of thermal expansion between the base substrate 100 and the first semiconductor layer 112. The base substrate 100 may tend to cool slower than the first semiconductor layer 112 when the substrate cools in the case of a silicon base substrate 100 and GaN first semiconductor layer 112. In that case, a tensile stress arises in the first semiconductor layer 112 in the direction of the arrows. Alternatively, the coefficients of thermal expansion of the materials could be such that the force is in an opposite direction, and a compressive stress arises in the first semiconductor layer 112 when the substrate cools. In the absence of further measures, these forces can cause significant bowing or warpage of the wafer. This high non-planarity makes the wafer difficult or impossible to process in standard fabrication equipment. It can also degrade pertinent electrical properties of the first semiconductor layer 112 and can even cause the first semiconductor layer 112 to completely crack or cause the substrate 100 to form slip-lines.

Advantageously, the crystalline properties of the third regions of the 114 of the first semiconductor layer 112 alleviate mechanical stress and prevent the compound semiconductor substrate from bowing or cracking. The relatively weak crystalline structure of the third regions 114 causes the third regions 114 to crack under mechanical stress. In fact, the process can be controlled such that the third regions 114 will consistently and reliably crack during the epitaxy process. These cracks allow the fourth regions 116 to expand (in the case of tensile stress) or contract (in the case of compressive stress) and therefore relieve the stress. The cracks in the third regions 114 physically decouple the adjacent ones of the fourth regions 116 from one another.

Referring to FIG. 5, a partial plan-view perspective of the compound substrate, according to an embodiment is depicted, according to an embodiment. The overall shape and size of the compound substrate may vary. For example, the compound substrate can be circular shaped in the case of a typical silicon wafer.

As can be seen, the third regions 114 are formed as spaced apart tracks (i.e., one of a series of parallel or concentric paths) in the first semiconductor layer 112. Each set of tracks separates adjacent ones of the fourth regions 116 from one another. The tracks may be formed in two different perpendicular directions as shown in the figure. The size and location of the spaced apart tracks can be easily determined and controlled using the patterning process described with reference to FIG. 2. The fourth regions 116 of the compound substrate can provide the active device areas for one or more semiconductor devices. Any of a variety of commonly known processing techniques can be used to form active device regions, e.g., source, drain, collector, emitter, etc., in the fourth regions 116 and corresponding interconnections.

According to an embodiment, the compound semiconductor substrate is cut along the tracks formed by the third regions 114. Exemplary cutting lines 124 are shown in FIG. 5. The cutting process may be a laser cutting process or a mechanical sawing process, for example. Conventionally with these processes, the risk of chipping or cracking around the dicing locations is significant, particularly in the case of cutting monocrystalline GaN material. Advantageously, by using the third regions 114 as dicing locations, the risk of cutting or chipping is greatly reduced, as these regions are substantially devoid of monocrystalline material and separate much easier.

As a result of the cutting process, a semiconductor die 200 is formed. The semiconductor die 200 includes a number of the fourth regions 116, which provide the active device region of the die 200. The third regions 114 are disposed at least around a perimeter of the die 200, as these regions correspond to the dicing locations. Optionally, further ones of the third regions 114 may be centrally located with the die 200 so as to further alleviate mechanical stress in the above described processes.

Referring to FIG. 6, an exemplary compound substrate is depicted according to another embodiment. The compound substrate of FIG. 6 differs from the compound substrate of FIG. 5 with respect to the percentage ratio of area that is occupied by the third and fourth regions 114, 116. In this embodiment, the third regions 114 occupy more than an overall area of the compound semiconductor base substrate 100, and the fourth regions 116 occupy less than 50% of an overall area of the compound semiconductor base substrate 100. One advantage of this configuration is that it dramatically reduces the mechanical stress present in the first semiconductor layer 112 during epitaxy due to the large size of the fourth regions 114.

The compound substrate can be cut into a die 200 in a similar manner as described above. According to an embodiment, the die 200 includes a number of HEMT devices 202, wherein the fourth regions 116 provide active channel regions for the HEMT devices 202. HEMT devices 202 typically do not require a substantial majority of the overall die area to be dedicated to the active device regions. For example, in some HEMT device 202 structures, the active channel region (i.e., the buffer and barrier regions) only need to occupy 30% or less of the overall die area. The remaining area can be used for other circuit components, such as pads, power metal runners, and passive structures. Thus, the die 200 can be configured accordingly, with the third regions 114 can occupying 70% of the overall area of the compound semiconductor base substrate 100 and the fourth regions 116 occupying 30% of the overall area of the compound semiconductor base substrate 100.

As used herein "extends along a single lattice plane" requires substantial conformity with this requirement within process capability. That is to say, the surface may occasionally deviate from the <111> due to imperfections in the substrate and/or limitations of the wafer preparation process.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a compound semiconductor substrate, comprising:
   providing a crystalline base substrate comprising a first semiconductor material and having a main surface;
   processing the base substrate so as to damage a lattice structure of the base substrate in a first region that extends to the main surface without damaging a lattice structure of the base substrate in second regions that are adjacent to the first region; and
   forming a first semiconductor layer comprising a second semiconductor material on a portion of the main surface that includes the first and second regions, a third region of the first semiconductor layer covering the first region of the base substrate, a fourth region of the first semiconductor layer covering the second region of the base substrate, the third region having a crystalline structure that is disorganized relative to a crystalline structure of the fourth region;
   wherein the first semiconductor material has a different coefficient of thermal expansion than the second semiconductor material.

2. The method of claim 1, wherein providing the crystalline base substrate comprises providing a monocrystalline semiconductor base substrate with the main surface extending along a single crystal lattice plane, and wherein processing the base substrate comprises locally damaging the crystalline structure of the base substrate so as to disrupt the single crystal lattice plane in the first regions.

3. The method of claim 2, wherein the base substrate is a silicon substrate, wherein the main surface extends along a <111> crystal lattice plane of the silicon substrate, and wherein locally damaging the crystalline structure of the base substrate comprises exposing crystal lattice planes different than the <111> crystallographic plane at the main surface.

4. The method of claim 2, wherein processing the base substrate comprises:
   forming a patterned mask on the main surface, the patterned mask exposing the first regions of the base substrate and covering the second regions of the base substrate; and
   applying charged ions that damage the crystalline structure of the semiconductor base substrate to the exposed first regions while the second regions remain covered by the mask.

5. The method of claim 4, wherein applying the charged ions comprises at least one of: plasma treatment or ion implantation.

6. The method of claim 2, wherein forming the first semiconductor layer comprises epitaxially depositing the second semiconductor material on the portion of the main surface that includes the first and second regions such that the crystalline structure of the second semiconductor material is dependent upon the crystalline structure of the base substrate.

7. The method of claim 6, wherein epitaxially depositing the second semiconductor material comprises a high temperature epitaxial deposition process, wherein the base substrate and the first semiconductor layer are cooled after the high temperature deposition epitaxial process, wherein the cooling process induces a mechanical stress in the first semiconductor layer due to the different coefficients of thermal expansion, and wherein third region disrupts the mechanical stress.

8. The method of claim 7, wherein the third region cracks during the high temperature epitaxial deposition process or the cooling process, and wherein the cracks disrupt the mechanical stress by permitting the fourth region to expand or contract under the mechanical stress.

9. The method of claim 6, wherein epitaxially depositing the second semiconductor material comprises:
   epitaxially depositing a transition layer on the main surface, the transition layer comprising the second semiconductor material, a fifth region of the transition layer being formed on the first region of the base substrate, a sixth region of the first semiconductor being formed on the second region of the base substrate; and
   epitaxially depositing the first semiconductor layer on the transition layer, the first semiconductor layer comprising the second semiconductor material and not the first semiconductor material, the third region of the first semiconductor layer being formed on the fifth region of the transition layer, the fourth region of the first semiconductor layer being formed on the sixth region of the transition layer.

10. The method of claim 6, wherein the epitaxial deposition process is controlled such that the third regions are polycrystalline regions of the second semiconductor material.

11. The method of claim 6, wherein the epitaxial deposition process is controlled such that the third regions are amorphous regions of the second semiconductor material.

12. The method of claim 2, wherein the third regions form spaced apart tracks in the first semiconductor layer, the method further comprising:
 cutting the compound semiconductor substrate along the tracks so as to form one or more semiconductor dies, each one of the dies comprising one or more of the fourth regions of the first semiconductor layer.

13. The method of claim 2, wherein the first semiconductor material is silicon and the second semiconductor material is a type III-V semiconductor nitride.

14. The method of claim 13, wherein the third regions occupy 50% or more of an overall area of the compound semiconductor substrate, and wherein the fourth regions occupy 50% or less of an overall area of the compound semiconductor substrate.

15. The method of claim 14, further comprising:
 forming one or more HEMT devices in the compound substrate, wherein the fourth regions provide an active channel region for the one or more HEMT devices.

* * * * *